(12) United States Patent
Sander et al.

(10) Patent No.: US 6,185,118 B1
(45) Date of Patent: Feb. 6, 2001

(54) DRIVER CIRCUIT FOR DRIVING A HALF BRIDGE

(75) Inventors: Rainald Sander, Munich (DE); Axel Christoph, Graz (AT)

(73) Assignee: Infineon Technologies AG, Munich (DE)

( * ) Notice: Under 35 U.S.C. 154(b), the term of this patent shall be extended for 0 days.

(21) Appl. No.: 09/553,520

(22) Filed: Apr. 20, 2000

(30) Foreign Application Priority Data

Apr. 21, 1999 (DE) ............................................. 199 18 040

(51) Int. Cl.[7] ................................................. H02M 7/5387
(52) U.S. Cl. ....................................................... 363/132
(58) Field of Search ........................... 363/17, 98, 131, 363/132

(56) References Cited

U.S. PATENT DOCUMENTS

| | | | |
|---|---|---|---|
| 4,926,354 | * 5/1990 | Pattantyus | 363/98 |
| 5,099,138 | 3/1992 | Fukunaga . | |
| 5,253,157 | * 10/1993 | Severinsky | 363/98 |
| 5,352,932 | 10/1994 | Tihanyi . | |
| 5,706,189 | * 1/1998 | Majumdar et al. | 363/95 |
| 5,859,519 | * 1/1999 | Archer | 318/801 |
| 5,959,410 | * 9/1999 | Yamauchi et al. | 315/209 R |
| 5,959,850 | * 9/1999 | Lim | 363/17 |
| 5,969,964 | * 10/1999 | Mangtani | 363/132 |
| 6,014,326 | * 1/2000 | Koch | 363/132 |
| 6,049,475 | * 4/2000 | Azuma et al. | 363/98 |
| 6,068,037 | * 5/2000 | Yeager et al. | 156/566 |

* cited by examiner

*Primary Examiner*—Adolf Deneke Berhane
(74) *Attorney, Agent, or Firm*—Schiff Hardin & Waite

(57) ABSTRACT

In a driver circuit for driving a half bridge, that has a high-side semiconductor switch and a low-side semiconductor switch that are connected in series between a first and a second supply potential terminal, a drive is allocated to each of the two semiconductor switches that are respectively switched inhibited or transmissive by the respective semiconductor switches according to the direction of a drive signal. A load can be connected between the high-side semiconductor switch and the low-side semiconductor switch. For an inhibited state of a semiconductor switch, its drive terminal is charged approximately with the potential of the second supply potential terminal in order to attain a negative bias voltage of the drive terminal opposite the source terminal.

15 Claims, 3 Drawing Sheets

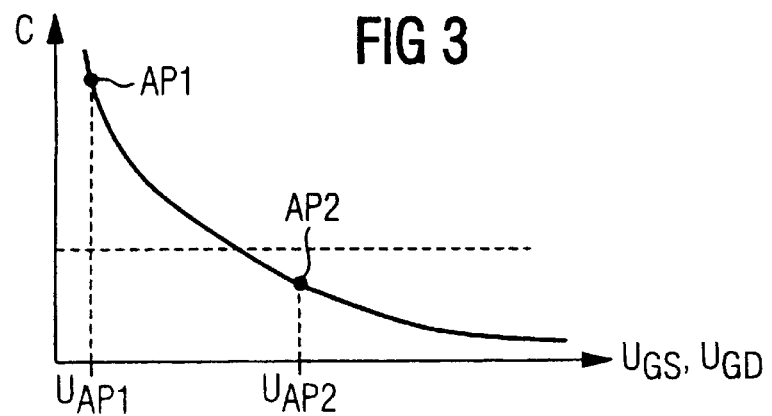

DRIVER CIRCUIT FOR DRIVING A HALF BRIDGE

BACKGROUND OF THE INVENTION

1. Field of the Invention

The present invention is directed to a driver circuit for driving a half bridge formed by a high-side semiconductor switch and a low-side semiconductor switch that are connected in series between a first terminal and a second terminal for a supply potential, with a driver allocated to each semiconductor circuit, the drive switching the respective semiconductor switches to be either transmissive or inhibited by a drive signal, and wherein a load can be connected between the high-side and the low-side semiconductor switch.

2. Description of the Prior Art

Semiconductor switches that are interconnected with a conductor path between a first supply potential terminal, that customarily carries the positive operating voltage, and a load output are characterized as high-side semiconductor switches. Low-side semiconductor switches, on the other hand, are interconnected with a conductor path between the load output and a second supply potential terminal. The second supply potential terminal then as a rule is a reference potential, e.g. ground potential. Each of the two semiconductor switches requires a drive that switches the respective semiconductor circuit transmissive or inhibited. When connecting a semiconductor circuit to form a half bridge, only one of the two semiconductor switches may be transmissive or inhibited at a given time. The drives respectively allocated to the high-side and the low-side semiconductor switches are consequently coupled together as a rule in order to accommodate this requirement. MOSFETs can be used, for example, as the semiconductor switches.

A drive for a high-side semiconductor switch is shown in FIG. 1, on the basis of which the basic manner of functioning will be explained. A MOSFET T1 is interconnected between a first supply potential terminal 1, carrying a positive operating load $V_{bb}$, and a load output 10. The drain terminal of the MOSFET T1 is connected with the first supply potential terminal 1 while the MOSFET is connected on the source side with the load output 10. A load RL that is connected on one side with the load output 10 and on the other side with a second supply potential terminal 2 is connected in a series with the load path of the MOSFET T1. A reference potential, e.g. the ground potential is at the supply potential terminal 2. Furthermore, a charge pump LP is provided that is connected to the gate of the MOSFET T1 via a resistor R1.

A bipolar transistor M3 is connected with its collector to the first supply potential terminal 1 and with its emitter to the junction between the charge pump LP and the resistor R1. When a voltage signal is supplied to its base by a control input ASL1, then the bipolar transistor M3 becomes transmissive and it can charge the gate of the MOSFET T1 together with the charge pump LP so that the MOSFET T1 is transmissive.

In order to reliably inhibit the MOSFET T1, another MOSFET M1 is provided that is of the opposite conductivity type as the MOSFET T1. The MOSFET M1 is connected with its drain terminal via the resistor R1 to the gate of the MOSFET T1, while the source terminal of the MOSFET M1 is connected to the source terminal of the MOSFET T1. A drive signal complementary to the control input ASL1 is at a control input ASS1 that is interconnected with the gate of the MOSFET M1.

To inhibit the MOSFET T1, it is consequently necessary to inhibit the bipolar transistor M3 with an appropriate drive signal while the MOSFET M1 is switched transmissive by the control input ASS1. As a result hereof, the gate of the MOSFET T1 is brought approximately up to the potential of the source terminal of the MOSFET T1, so that inhibiting the MOSFET M1 is achieved. A detailed exemplary embodiment of a drive for a MOSFET with a source-side load is described, for example, in European Application 0 572 706.

The drive for a low-side semiconductor switch is constructed identically in principle. One can, however, omit the charge pump LP since no voltage is needed at the gate of the corresponding power switch that exceeds the operating voltage $V_{bb}$.

Frequently, several half bridges are connected together in practice. An H-bridge circuit formed by two half bridges is known and is shown, for example, in FIG. 2. Such a full bridge is used, e.g. for the drive of motor loads. The H-bridge circuit allows a change in direction of the load current.

The series-circuit formed by the high-side semiconductor switch T1 and T2 as well as the low-side semiconductor switches T3 and T4 is connected between the first supply potential terminal 1 and the second supply potential terminal 2. A load RL that can be, e.g. a motor, is connected between the load outputs 10 and 10'. The semiconductor switches T1 and T4 are inhibited in the present embodiment via the drives (not shown). The load current consequently flows from the first supply potential terminal 1' via the high-side semiconductor switch T2, the load output 10', the load RL, the load output 10 as well as the low-side semiconductor switch T3. In the specific exemplary embodiment of the FIG. 2, the low-side semiconductor switch T3 is driven by a high frequency pulse width modulation signal while the high-side semiconductor switch T2 is switched to permanently transmissive. As a result, regulation of the load current is possible. Dependent on the on- and off-switching of the low-side semiconductor switch T3, the potential of the load output 10 changes with higher frequency between the supply voltage $V_{bb}$ and the ground potential.

Dependent on the technological construction of a MOSFET, a capacitive coupling exists between the gate and the drain, or between the gate and the source. The capacitance which exist between the gate and the drain is characterized as a "Miller capacitance" (Also known as the Miller-effect capacitance). The Miller capacitance of the semiconductor circuit T1 is indicated as C1 dashed-lines connections.

The Miller capacitance C1 between the gate and the drain of the high-side semiconductor switch prevents, however, the gate voltage from following the source voltage at the load output 10 in a manner corresponding to the rapid potential change produced by the pulse width modulation of the low-side semiconductor switch T3. If, for example, the low-side semiconductor switch T3 is transmissive, the potential changes at the load output 10 from the operating voltage $V_{bb}$ to the ground potential. Dependent on the Miller capacitance C1, a gate-source-voltage forms at the high-side switch T1, which can briefly engage the semiconductor circuit T1 and thereby produce an undesired quadrature-axis component. This quadrature-axis component leads to a temperature boost in the semiconductor switch T1 and can cause undesired function disturbances to occur in the entire circuit arrangement.

Frequently, three half bridges are interconnected to a three-phase bridge arrangement that can then drive, for example, a brushless three phase motor. Since the semiconductor switches of a three-phase motor can also be driven very high-frequency by a pulse width control, disruptive quadrature-axis components are problematic here as well.

A driver circuit for driving a half bridge is disclosed, for example, in German OS 40 32 014. In the circuit arrangement described therein, the state (semiconductor switch transmissive or inhibited) of the two semiconductor switches is detected and it is assured by an appropriate drive that one of the two semiconductor switches can only be switched transmissive if the other is already in the inhibited state. To this end, down times are provided between the switching events of the individual semiconductor switches. The procedure described therein exhibits the disadvantage, however, that the semiconductor switches can not be driven at arbitrarily high frequencies. Furthermore, the problematic issue of the Miller capacitance is not taken into consideration. In the driver circuit therein, the switched-off semiconductor switch can become switched-on due to the effect of the Miller capacitance, when the other semiconductor switch is being driven at that time in the transmissive state.

SUMMARY OF THE INVENTION

An object of the present invention is to provide a driver circuit for driving a half-bridge that prevents unintended switching of a semiconductor switch, that is in an inhibiting state, to a transmissive state in accordance with the invention in a driver circuit of the type initially described wherein the drive allocated to a semiconductor switch for an inhibited state loads the control terminal of that semiconductor switch approximately with the potential of the second supply potential terminal. This has the result of reducing the magnitude of the Miller capacitance of the semiconductor switch to be inhibited. By reducing the Miller capacitance, the cutoff voltage at the inhibiting switch is prevented from being exceeded by the changing of the potential at its source terminal from the operating voltage to the reference potential, and is prevented from conducting a quadrature-axis component.

In an embodiment at least one of the drives allocated to each semiconductor switch has an inhibiting arrangement provided between the control terminal and the second supply potential terminal. In an H-bridge circuit, for example, this allows the pulse width modulation signal to be selectively applied to the high-side semiconductor switch or the low-side semiconductor switch. The inhibiting arrangement can be, or can include, a controllable semiconductor switch.

In a further embodiment, the inhibiting arrangement also includes a diode connected in series with the load conductive path of the semiconductor switch of the inhibiting arrangement. This diode causes the source terminal of the inhibited semiconductor switch always to be at a lower potential than the gate terminal of the semiconductor switch to be inhibited.

In another embodiment, the inhibiting arrangement is connected between the control terminal and the source terminal of the semiconductor switch to be inhibited. As a result, the Miller capacitance can be reduced given a high-side semiconductor switch as well as given a low-side semiconductor switch.

In another version of the embodiment, a resistor is connected between the semiconductor switch of the inhibiting arrangement and the second supply potential terminal. Usually the reference potential of the drive circuit is not the same as the reference potential in the conductive path. This could cause a higher potential opposite the source terminal to occur at the control terminal of the semiconductor switch to be inhibited given fluctuations of the reference potential. In this event, the semiconductor switch would be transmissive. This problem is reduced by means of the resistor. Given undesired ground potential fluctuations, this assures that reliable inhibiting of the high-side semiconductor switch or the low-side semiconductor switch is maintained.

In another version of the embodiment wherein the inhibiting arrangement includes a diode, another semiconductor switch is provided that is interconnected with its conductive path between the first supply potential terminal and the junction of the semiconductor switch to the diode inhibiting arrangement, and the control terminal thereof is connected to the respective drive. This other semiconductor switch makes it possible to bring the potential of the source terminal of the semiconductor switch of the inhibiting arrangement to a high reference potential in order to assure that this can change to an inhibited state. As a result, a connection of the high-side semiconductor switch or the low-side semiconductor switch is in turn possible. The provision of the additional semiconductor switch, moreover, allows faster switching events of the driver arrangement.

In another embodiment of the invention, a semiconductor switch is connected in parallel with the semiconductor switch of the inhibiting arrangement, the gate and source terminals of which are connected to a switch controllable with a drive signal. Furthermore, a semiconductor switch is also connected in parallel with the diode of the inhibiting arrangement. By means of these circuit elements, the pulse width modulated semiconductor switch of the half-bridge can also be operated at very large duty-cycles independent of the frequency without the semiconductor switch of the half-bridge to be inhibited becoming unintentionally inhibited. This is achieved by using a very low impedance semiconductor switch as the semiconductor switch connected parallel to the semiconductor switch of the inhibiting arrangement, whereas the semiconductor switch of the inhibiting arrangement is designed as a rule for the requirements of a given slew rate. In this manner, a clamping of the gate terminal of the semiconductor switch of the half-bridge becomes possible independent of the slew rate of the semiconductor switch of the inhibiting arrangement.

Preferably, the inhibiting arrangement inhibits the allocated semiconductor switch only just before the other semiconductor switch becomes transmissive. This is of particular significance when the high-side and the low-side switches of a half-bridge are operated by pulse width modulation in order to prevent a direct current path between the first and the second supply potential terminals.

In a further embodiment, a first voltage detector is allocated to the low-side semiconductor switch and a second voltage detector is allocated to the high-side semiconductor switch. These detectors respectively acquire the voltage at the control terminal of the allocated semiconductor switch and are respectively connected to the drive of the non-allocated semiconductor switch. The first voltage detector enables the transmissive switching of the high-side semiconductor switch after the inhibiting of the low-side semiconductor switch of the drive. The second voltage detector enables the transmissive switching of the low-side semiconductor switch after the inhibiting of the high-side semiconductor switch of the drive.

The first voltage detector can be a semiconductor switch, the control terminal of which is connected to the control terminal of the low-side semiconductor switch, and the conductive path of which lies between the control terminal of the high-side semiconductor switch and the second supply potential terminal. In this manner, the state of the low-side semiconductor switch can be detected by means of a single component.

The second voltage detector can be a first voltage divider, having a center tap connected to a second voltage divider, the center tap of the second voltage divider being connected to and driving the driver allocated to the low-side semiconductor switch. As a result, the state of the high-side semiconductor switch is detectable and at the same time a transmissive switching of the low-side semiconductor switch becomes possible for the driver arrangement of the low-side semiconductor switch only when the high-side semiconductor switch is in the inhibited state.

DESCRIPTION OF THE DRAWINGS

FIG. 1, as described above, shows a known drive circuit for a high-side semiconductor switch.

FIG. 2 shows a known H-bridge circuit.

FIG. 3 shows the curve of the Miller capacitance dependent on the gate-source (and gate-drain) voltage of a semiconductor switch.

DESCRIPTION OF THE PREFERRED EMBODIMENTS

Figure 4:
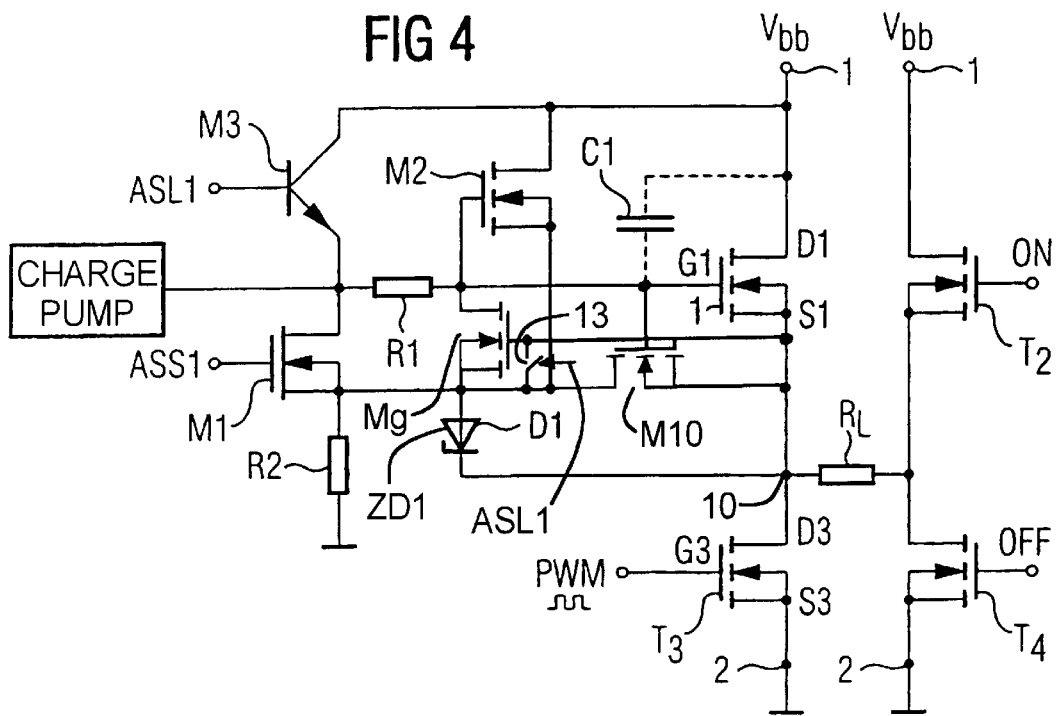
FIG. 4 shows an exemplary embodiment of a drive circuit for a high-side semiconductor switch according to the invention

FIG. 3 shows the sequence of the Miller capacitance dependent on the gate-drain voltage $U_{GD}$ of a semiconductor switch, particularly a MOSFET. The same dependency results for the gate-source voltage $U_{GS}$. The Miller capacitance is then greatest when the voltage difference between the gate and the drain is "0". One operating point that the Miller capacitance assumes given a circuit arrangement according to the Prior Art is referenced AP1. If a semiconductor switch is to be inhibited according to the Prior Art, then its gate-source voltage is made approximately zero. When the load output from FIG. 1 is, for example, at the supply potential $V_{bb}$, then the gate also approximately lies at $V_{bb}$. If the load output is brought to the reference potential by means of a switching event of the low-side semiconductor switch of the half bridge, then the potential at the gate of the high-side semiconductor switch must also follow the potential of the load output. The operating point AP1 would consequently have to migrate further to the right on the characteristic curve shown in FIG. 3. This means the Miller capacitance would very rapidly become recharged. In practice, however, this recharging event is not rapid enough so that the gate-source voltage of the high-side circuit would not exceed the cut-off voltage. This causes the high-side semiconductor switch to become transmissive for a short time.

When the low-side semiconductor switch of the half-bridge switches between a transmissive state and an inhibited state with very high frequency, then the short-term activation of the semiconductor switch occurs corresponding to the drive frequency. The energy converted in the semiconductor switch is so high that the high-side semiconductor switch could be thermally destroyed. When the capacitance of an inhibited semiconductor switch lies above the straight line running parallel to the x-axis in FIG. 3, then the danger of a quadrature-axis component exists. The smaller the Miller capacitance is, however, given a potential change at the load output, the slighter the danger of a quadrature-axis component becomes.

According to the invention, the potential difference between the gate and source is not forced to zero. On the contrary, the gate of the inhibited semiconductor switch is brought closer to the second supply potential. A larger voltage drop across the Miller capacitance thus occurs due to the limited potential at the gate of the semiconductor switch to be inhibited. This is characterized in FIG. 3 by the operating point AP2. This has the advantage that significantly less time is needed for recharging the Miller capacitance, i.e. the operating point AP2 can migrate to the right much faster along the characteristic curve. Furthermore, it is assured by means of the biasing of the gate relative to the source terminal that the cut-off voltage of the semiconductor switch to be inhibited can not be exceeded. Physically, this means that an inversion layer is formed under the gate given a sufficiently large negative gate voltage opposite the source terminal, which shields the gate from the substrate and, in this manner, reduces the effect of the Miller capacitance. It is therefore essential to build up a voltage across the Miller capacitance, by bringing the gate of the semiconductor switch to be inhibited to, for example, reference potential.

In FIG. 4, a first exemplary embodiment is illustrated for the drive of a high-side semiconductor switch, at which a quadrature-axis component can be avoided. FIG. 4 shows an inventive solution for the H-bridge circuit already described in FIG. 2. The drive for the transmissive switching of the high-side semiconductor switch T1, a MOSFET in the present embodiment, is accomplished by a charge pump LP and a bipolar transistor M3. The charge pump LP is connected via a resistor R1 with the gate G1 of the MOSFET T1. The bipolar transistor M3 is provided between the first supply potential terminal 1 and the junction of the charge pump LP with the resistor R1. A control signal can be applied at the base of the bipolar transistor M3 via a control input ASL1.

The drain D1 of high-side semiconductor switch T1 is connected to the first supply potential terminal 1 and the source S1 to a load output 10. The load output 10 is connected to a load $R_L$ and to the drain D3 of a pulse width modulated low-side semiconductor switch T3 (e.g. a MOSFET). The source S3 of the semiconductor switch T3 is connected to a second supply potential terminal 2, at e.g. reference potential.

A semiconductor switch M1 is provided for switching the high-side semiconductor switch T1 to an inhibited state. On the drain side, the semiconductor switch M1 is connected with the junction between the charge pump and the resistor R1. On the source side, the semiconductor switch M1 is connected with an anode of a Zener diode ZD1. The cathode of the Zener diode ZD1 is connected with the load output 10. Furthermore, a resistor R2 is connected at the source terminal of the semiconductor switch M1. The other side of the resistor R2 is connected to the second supply potential terminal 2. The resistor R2 serves the purpose of clamping the gate G1 of the high-side semiconductor switch T1 via the discharging path of the resistor R1 and the load path of the semiconductor switch M1 to the potential at the second supply potential terminal 2. The diode ZD1 allows higher voltages, given an inhibited semiconductor switch T1, at its source terminal S1 than at the gate G1.

The drain of an additional semiconductor switch M2 is connected to the first supply potential terminal 1. The source terminal of the switch M2 is connected with the source terminal of the semiconductor switch M1. The additional semiconductor switch M2 is of the same type as the high-side semiconductor switch T1. The gate of the additional semiconductor switch M2 is connected with the gate G1 of the high-side semiconductor switch T1.

The semiconductor switch M1 is usually dimensioned such that it causes no disturbing electromagnetic emission. This means its slew rate, i.e. the maximum current rate of change speed, is limited. In spite of the inventive clamping of the gate of the semiconductor switch T1, given unfavorable duty cycles of the pulse width modulated low-side semiconductor switch T3, this dimensioning could cause this semiconductor switch T1 to briefly conduct a quadrature-axis component. This is prevented by an additional semiconductor switch M9 that is connected on the source side with the source terminal of the semiconductor switch M1 and on the drain side with the gate G1 of the semiconductor switch T1. The gate terminal of the semiconductor switch M9 is connected with the source terminal S1 of the semiconductor switch T1. Furthermore, an additional semiconductor switch M10 is provided that has a conductive path in parallel to the diode ZD1. The source side of the switch M10 is connected to the source terminal of the semiconductor switch M1. The gate terminal G1 of the semiconductor switch M10 is connected with the gate terminal of the semiconductor switch T1. A switch 13 is provided between the gate and the source terminal of the semiconductor switch M9 that can be operated with the drive signal ASL1.

When the high-side semiconductor switch T1 is brought from a transmissive into the inhibited state, its gate G1 is discharged via the semiconductor switch M1. During the discharging event, the semiconductor M9 is in the inhibited state, while the semiconductor M10 is transmissive. Only when the gate voltage of the semiconductor switch T1 has become smaller that its source voltage does the semiconductor switch M10 become inhibited so that the semiconductor switch M9 can proceed into the transmissive state. In the inhibited state of the semiconductor switch T1 of the half bridge, the semiconductor switch M9 is in the transmissive state, but this is implemented at very low impedance in comparison to the semiconductor switch M1. The semiconductor switch M10 is then in the inhibited state, and the switch 13 is opened.

When the potential at the output 10 changes on the basis of the pulse width modulated semiconductor switch T3 from the potential of the second supply potential terminal 2 to the supply potential terminal $V_{bb}$, then the gate G1 is raised capacitively via the potential at the junction between M1 and R2. While this junction is being clamped via the resistor R2 at the second supply potential terminal 2, the clamping of the gate G1 is determined by the semiconductor switch M1. This is dependent on the slew rate of the semiconductor switch M1. If the output 10 is only briefly at the supply potential terminal $V_{bb}$ and then is connected again to the reference potential at the second supply potential terminal 2, the clamping of the gate G1 via the semiconductor switch M1 is no longer adequate to discharge the gate G1 fast enough. For a short time, the cut-off voltage of the semiconductor switch T1 therefore can be exceeded so that it becomes transmissive. This undesired state is prevented by the above-described circuit arrangement with the semiconductor switches M9 and M10.

When the high-side semiconductor switch is to be switched into a transmissive state, then the bipolar transistor M3 is switched to be transmissive via the corresponding drive signal at the control inputs ASL1, while the semiconductor switch M1 is inhibited by a corresponding drive signal ASS1. When the bipolar transistor M3 is in the transmissive condition, then the gate of the semiconductor switch M2 is charged via the resistor R1 and the charge pump LP so that the bipolar transistor M3 begins to conduct. In this instance, the reference potential $V_{bb}$ occurs at the source terminal of the semiconductor switch M1. Together with the corresponding drive signal ASS1, the semiconductor switch M1 is reliably brought into the inhibited state so that the charge produced by the charge pump LP in combination with the bipolar transistor M3 can flow to the gate G1 of the high-side semiconductor switch T1 thereby switching it to a transmissive state.

The switch 13 is also switched transmissive (closed) by the drive signal at the control input ASL1 so that the semiconductor switch M9 becomes inhibited. As a result the current produced by the charge pump LP in combination with the bipolar transistor M3 can flow to the gate G1 of the semiconductor switch T1. Any turn-on delay thus is kept slight.

The advantage of the inventive circuit arrangement is that the gate G1 of the high-side semiconductor switch T1 need not follow the voltage at the source terminal given a potential change at the load output 10 from the supply potential $V_{bb}$ to the reference potential. The effect of the Miller capacitance that seeks to be at the potential of the gate terminal G1 on the basis of capacitive coupling, as is the case in the prior art, is thereby prevented. A quadrature-axis component is precluded.

Figure 5:
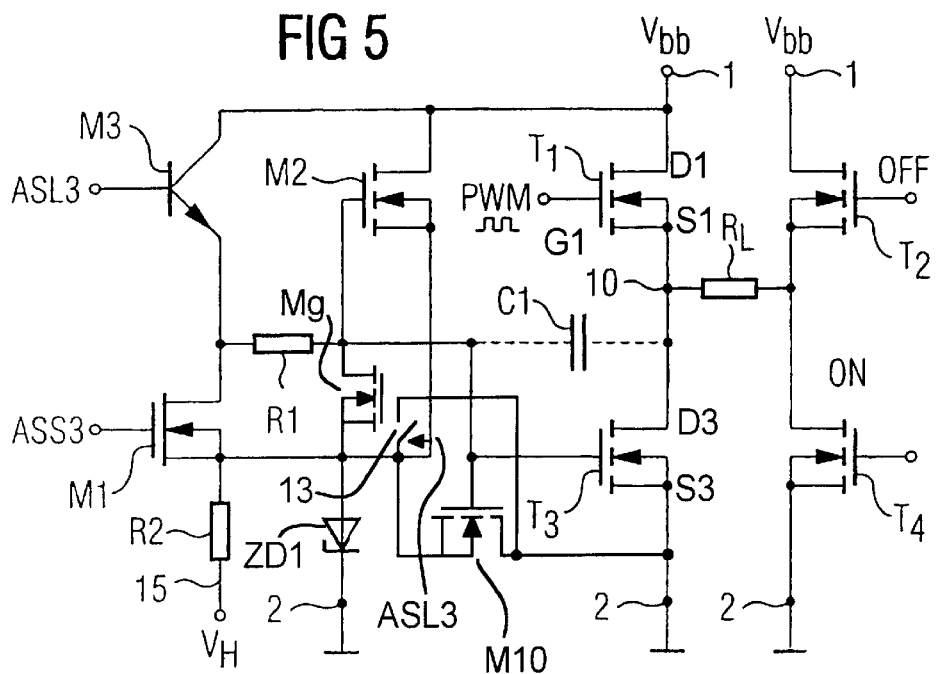
FIG. 5 shows an exemplary embodiment of a drive for a low-side semiconductor switch according to the invention.

An exemplary embodiment for a control circuit for a low-side semiconductor switch is illustrated in FIG. 5. In this case, the high-side semiconductor switch T1 of the half bridge is charged by a pulse width modulated signal. The low-side semiconductor switch T4 of the second half bridge is switched permanently transmissive, while the high-side semiconductor switch T2 of the second half bridge is shut off.

The drive circuit for a low-side semiconductor switch is constructed in basically the same way as a high-side semiconductor switch. One difference is that no charge pump is needed for driving the low-side semiconductor switch. Another difference is that the resistor R2 is at a terminal for an auxiliary voltage VH instead of the second supply potential terminal 2. The auxiliary voltage VH can be selected to be smaller than the potential at the second supply potential terminal 2.

The critical switching state at a low-side semiconductor switch occurs upon a rise of the potential at the load output 10 from the reference potential of the second supply potential terminal 2 to the supply voltage $V_{bb}$. In this case, a brief rise in the gate voltage can occur due to capacitive coupling between the drain and the gate G3 of the low-side semiconductor switch T3 so that the cut-off voltage of the MOSFET T3 might be exceeded. The Miller capacitance is therefore reduced by bringing the gate G3 of the low-side semiconductor switch T3 to a negative potential relative to the second supply potential terminal 2 by means of the auxiliary voltage VH. In this case, the operating point is in turn below the critical level that runs parallel to the x-axis from FIG. 3.

Figure 6:
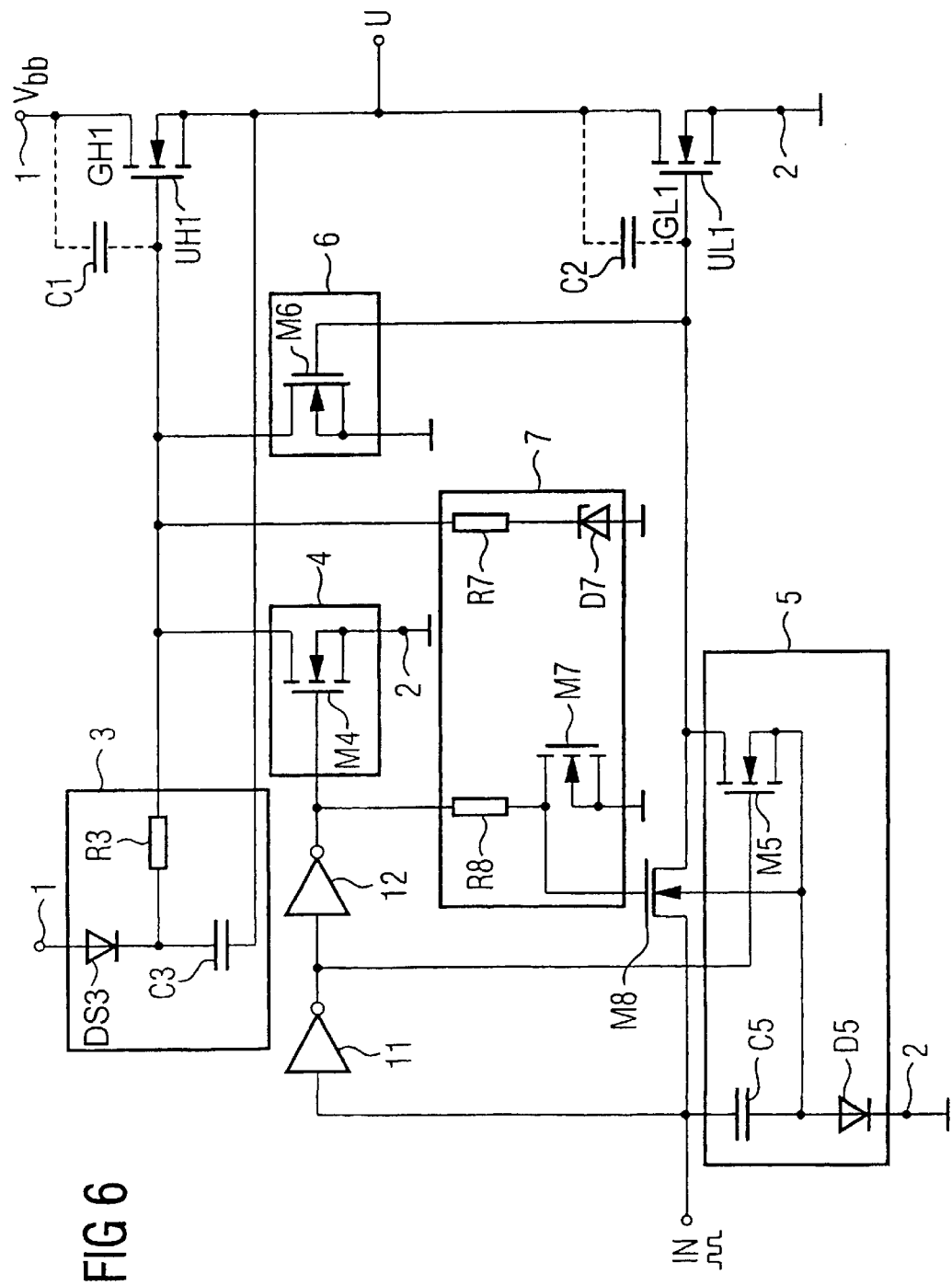
FIG. 6 shows another exemplary embodiment of an inventive driver circuit for use in a three-phase bridge circuit.

FIG. 6 shows an additional exemplary embodiment for a driver circuit of a half bridge, which is applicable for a three phase bridge connection. The high-side semiconductor switch as well as the low-side semiconductor switch are accordingly switched transmissive and inhibited at a frequency applied at a control input IN. The half bridge according to the third exemplary embodiment has two series interconnected semiconductor switches UH1, UL1. The high-side semiconductor switch UH1 is connected on the drain side with the first supply potential terminal 1 and on the source side with a load output U and the drain terminal of the low-side semiconductor switch UL1. On the source side, the low-side semiconductor switch UL1 is connected with the second supply potential terminal 2 that is at the reference potential.

The driver circuit has a first driver stage 3 that is allocated to the high-side semiconductor switch UH1. The driver stage 3 is connected between the first supply potential terminal 1 and across the gate GH1, the source of the MOSFET UH1. The driver stage 3 is constructed in the form of a bootstrap circuit, i.e. it has a diode DS3, a charge storage C3 and a resistor R3. The anode of the diode DS3 is connected to the first supply potential terminal 1. The cathode side of the diode DS3 is connected to the resistor R3 and to the charge storage C3. The other side of the charge storage C3 is connected to the source terminal of the MOSFET UH1.

A second driver stage 8 is allocated to the low-side semiconductor switch UL and is formed by an n-channel depletion mode semiconductor switch M8. The conductive path terminals of the MOSFET M8 are connected at one side to the control input IN, at which a pulse width modulated signal is present and on the other side to the gate GL1 of the low-side semiconductor switch UL1 implemented as a MOSFET.

The driver circuit further has a first voltage detector 6 and a second voltage detector means 7. The first voltage detector 6 is allocated to the low-side semiconductor switch UL1 and is an n-channel depletion mode MOSFET M6. The drain terminal of the semiconductor switch M6 is connected to the gate GH1 of the high-side semiconductor switch UH1. On the source side, the semiconductor switch M6 is connected to the second supply potential terminal 2. The gate of the semiconductor switch M6 is connected to the gate GL1 of the low-side semiconductor switch UL1. The semiconductor switches M6 and UL1 are of opposite channel types.

The second voltage detector 7 is formed by a first voltage divider formed by a resistor R7 and a diode D7 and a second voltage divider formed by a resistor R8 and a semiconductor switch M7. The diode is preferably a Zener diode with its anode connected to the second supply potential terminal 2, and its cathode connected to the resistor R7. The resistor R7 is further connected to the gate GH1 of the high-side semiconductor switch UH1. The center tap of the first voltage divider R7, D7 is connected to the control terminal of a semiconductor switch M7 implemented as a MOSFET. The source terminal thereof is connected to the second supply potential terminal 2. The drain terminal is connected to the resistor R8 that is also connected to the output of an inverter 12. The center tap of the second voltage divider R8, M7 is connected with the control terminal of the driver stage 8 (gate of the MOSFET M8).

The control input IN is further connected to an input of an inverter 11, the output of which is connected to the input of the second inverter 12 and to an inhibiting arrangement 5 allocated to the low-side semiconductor switch UL1. The output of the first inverter 11 is further connected to the gate of a MOSFET M5. This inhibiting arrangement 5 allocated to the low-side semiconductor switch UL1 includes the semiconductor switch M5 exemplified as a MOSFET, a charge storage C5 as well as a diode D5. The first terminal of the charge storage C5 is connected with the input IN. The other terminal of the charge storage C5 is connected to the anode terminal of the diode D5 and to the source terminal of the MOSFET M5. Furthermore, there is a connection from the second terminal of the charge storage C5 to the substrate of the MOSFET M8. The cathode of the diode D5 is connected to the second supply potential terminal 2 The drain terminal of the MOSFET M5 is connected to the gate GH1 of the low-side semiconductor switch UL1.

The inhibiting arrangement 4 allocated to the high-side semiconductor switch UH1 is formed by a single semiconductor switch M4 exemplified as a MOSFET. The drain of M4 is connected to the gate GH1 of the high-side semiconductor switch UH1, and the source of M4 is connected to the second supply potential terminal 2.

The manner in which the driver circuit functions is as follows:

A state is assumed in which a logic "low" is present at the control input IN. This has the consequence that the high-side semiconductor switch UH1 is in the transmissive state, while the low-side semiconductor switch UL1 is inhibited. Consequently, the operating voltage $V_{bb}$ exists at the load output U. If the signal at the input IN changes from a logic low" to a logic "high", then the MOSFET M4 is switched transmissive via the two inverters 11, 12. The high-side semiconductor switch UH1 begins to inhibit. The voltage at the gate GH1 of the MOSFET UH1 is detected by the voltage divider R7, D7. The MOSFET M8 is switched transmissive by the voltage divider R8, M7 in order to switch the low-side semiconductor switch UL1 transmissive. To enable the transmissive switching of the MOSFET UL1, the MOSFET M7 must be switched off. The switching off of the MOSFET M7 only ensues when the voltage at the gate GH1 of the high-side semiconductor switch UH1 has dropped so far that the Miller capacitance of the MOSFET UH1 is already so small so that a quadrature-axis component can no longer be produced by the MOSFET UH1 on the basis of a connection to the low-side semiconductor switch UL1. As long as the low-side semiconductor switch UL1 is in the transmissive state, the MOSFET M5 is inhibited via the output of the first inverter 11. The MOSFET M6 is in the inhibited state during the transmissive state of the low-side semiconductor switch UL1, i.e. the depletion mode transistor M6 exhibits a positive gate-source voltage.

When the signal at the control input IN changes back to a logic "low", then the MOSFET M5 is switched transmissive via the inverter 11. Also, a negative voltage is briefly generated via C5 at the anode of D5 so that the gate GL1 of the low-side semiconductor switch UL1 is brought to a negative potential in order to make the Miller capacitance C2 of UL1 smaller. As soon as a logic "low" exists at the control input IN, the MOSFET M4 switches to the inhibited state. The gate of the MOSFET M8 is brought to the supply potential 2 via the voltage dividers R7, D7 and R8, M7. Its substrate is at negative potential, so that M8 is brought to the inhibited state. A continued flow of charge via the MOSFET M8 that essentially represents a controllable resistor is thereby no longer possible. Because the MOSFET M4 is in the inhibited state, however, a continued flow of charge to the gate GH1 of the high-side semiconductor switch UH1 would be possible. This is suppressed by the MOSFET M6 as long as the voltage at the gate GL1 of the low-side semiconductor switch UL1 has not reached a value that results in a limited Miller capacitance. Only as soon as the Miller capacitance is small enough so that a quadrature-axis component is suppressed by the low-side semiconductor switch UL1 during the switching on of the high-side semiconductor switch UH1, is the semiconductor switch M6 inhibited. Only now can the gate GH1 of the high-side semiconductor switch UH1 be biased in order to bring the high-side semiconductor switch UH1 into the transmissive state.

Using the inventive driver circuit, it is thereby possible to prevent quadrature-axis components in half bridges in a simple manner. It is insignificant whether only one of the two semiconductor switches is switched transmissive and inhibited by means of a pulse width modulated signal or if, however, both semiconductor switches are switched transmissive and inhibited in a mutual change.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a half-bridge circuit having a high-side semiconductor switch connected between a first potential supply terminal and a junction to a load, and a low-side semiconductor switch connected between said junction and a second potential supply terminal, each of said semiconductor switches having a control input, and wherein one of said semiconductor switches is operated as a modulate switch by a modulating signal which alternatingly causes said modulated switch to be transmissive and inhibited, and wherein the other of said semiconductor switches is operated by a drive circuit as a driven switch dependent on at least one control signal so that only one of said semiconductor switches is inhibited at a time, the improvement comprising:

said drive circuit including circuitry for inhibiting said driven switch by charging the control terminal of the driven switch approximately with a potential at said second supply potential terminal.

2. The improvement of claim 1 wherein said drive circuit further includes inhibiting circuitry connected between said control terminal and said second supply potential terminal.

3. The improvement of claim 2 wherein said inhibiting circuitry includes a controllable semiconductor switch.

4. The improvement of claim 3 wherein said controllable semiconductor switch has a conductive path, and wherein said inhibiting circuitry further includes a diode connected in series with said conductive path.

5. The improvement of claim 4 wherein said driven switch is said high-side semiconductor switch and wherein said high-side semiconductor switch has a source terminal, and wherein said inhibiting circuitry is connected between said control terminal and said source terminal of said high-side semiconductor switch.

6. The improvement of claim 3 wherein said inhibiting circuitry further comprises a resistor connected between said controllable semiconductor switch and said second supply potential terminal.

7. The improvement of claim 4 wherein said driven switch is said low-side semiconductor switch, and wherein said diode is connected between said conductive path of said low-side semiconductor switch and said second supply potential terminal, and wherein said inhibiting circuit further comprises a third supply potential terminal and a resistor connected between said conductive path of said low-side semiconductor switch and said third supply potential terminal.

8. The improvement of claim 4 further comprising an additional semiconductor switch having a conductive path connected between said first supply potential terminal and a junction of said driven switch and said diode, said additional semiconductor switch having a control input connected to said drive circuit.

9. The improvement of claim 4 further comprising an additional semiconductor switch connected in parallel with said controllable semiconductor switch of said inhibiting circuit, said additional semiconductor switch having a gate terminal and a source terminal, a switch connected across said gate terminal and said source terminal of said additional semiconductor switch operated by said control signal said diode being connected between a junction of said switch and said source terminal, and said second supply potential terminal, and said improvement further comprising a parallel semiconductor switch connected in parallel with said diode between said junction of said source terminal and said switch, and said second supply potential terminal.

10. The improvement of claim 2 wherein said inhibiting circuit inhibits the driven switch before said modulated switch becomes transmissive.

11. In a half-bridge circuit having a high-side semiconductor switch connected between a first potential supply terminal and a junction to a load, and a low-side semiconductor switch connected between said junction and a second potential supply terminal, each of said semiconductor switches having a control input, a first drive circuit for operating said high-side semiconductor switch in response to a control signal for alternatingly causing said high-side semiconductor switch to become transmissive and inhibited, and a second drive circuit for operating said low-side semiconductor switch in response to said control signal for alternatingly causing said low-side semiconductor switch to become transmissive and inhibited in opposition to said high-side semiconductor switch, the improvement comprising:

said first drive circuit including circuitry for inhibiting said high-side semiconductor switch by charging said control input of said high-side semiconductor switch approximately at said potential of said second supply potential terminal, and said second drive circuit including circuitry for inhibiting said low-side semiconductor switch by charging said control terminal of said low-side semiconductor switch approximately at said potential of said second supply potential terminal.

12. The improvement of claim 11 further comprising an inhibiting circuit, connected to at least one of said first drive circuit and said second drive circuit, as a connected drive circuit, for causing the semiconductor switch operated by the connected drive circuit to be inhibited before the semiconductor switch not operated by said connected drive circuit becomes transmissive.

13. The improvement of claim 12 further comprising a first voltage detector connected to said low-side semiconductor switch which detects a voltage at said control input of said low-side semiconductor switch, a second voltage detector connected to said high-side semiconductor switch which detects a voltage at said control input of said high-side semiconductor switch, said first voltage detector being connected to said second drive circuit and said second voltage detector being connected to said first drive circuit, and said first drive circuit operating said high-side semiconductor switch dependent on a voltage detected by said first voltage detector and said second drive circuit operating said low-side semiconductor switch dependent on a voltage detected by said second voltage detector.

14. The improvement of claim 13 wherein said first voltage detector comprises a semiconductor switch having a control terminal connected to the control input of the low-side semiconductor switch, and having a conductive path connected between the control input of the high-side semiconductor switch and said second supply potential terminal.

15. The improvement of claim 12 wherein said second voltage detector comprises a first voltage divider having a center tap, and a second voltage divider connected to said center tap of said first voltage divider, said second voltage divider having center tap connected to said second drive circuit.

* * * * *